United States Patent [19]

Roberts

[11] 4,187,388
[45] Feb. 5, 1980

[54] CIRCUIT BOARD WITH SELF-LOCKING TERMINALS

[75] Inventor: Joseph A. Roberts, Hudson, N.H.

[73] Assignee: Advanced Circuit Technology, Merrimack, N.H.

[21] Appl. No.: 898,623

[22] Filed: Apr. 21, 1978

Related U.S. Application Data

[62] Division of Ser. No. 808,808, Jun. 22, 1977, Pat. No. 4,107,836.

[51] Int. Cl.² ............................................. H05K 1/10
[52] U.S. Cl. ................................. 174/68.5; 339/17 E; 339/17 LC
[58] Field of Search ..................... 174/68.5; 339/61 R, 339/17 B, 17 D, 17 E, 17 LC

[56] References Cited

U.S. PATENT DOCUMENTS

| | | | |
|---|---|---|---|
| 2,958,064 | 10/1960 | Swengel | 339/61 R |
| 3,013,188 | 12/1961 | Kohler | 339/17 E |
| 3,022,480 | 2/1962 | Tiffany | 174/68.5 X |
| 3,200,020 | 8/1965 | Schroeder | 174/68.5 X |

OTHER PUBLICATIONS

Roche, K. J. & Palmateer, P. H., Circuit Board Connective Scheme, IBM Technical Disclosure Bulletin, v. 6, #8, Jan. 1964.

*Primary Examiner*—Richard R. Kucia
*Attorney, Agent, or Firm*—Strimbeck & Soloway

[57] ABSTRACT

The present invention provides an apertured circuit board having self-locking terminals which partially cover at least some of the apertures. The terminals, which are integral extensions of the circuit pathways, are adhesively anchored to the circuit board at the terminal peripheries and are covered in part by a dielectric overlay. The latter also provides environmental protection and electrical insulation to the circuit conductive pathways. A particular feature and advantage of the invention resides in the provision of an integral tie-down shoulder on each terminal for capturing by the dielectric overlay. The circuit board and integral sockets may be formed by photoimaging and chemical resist techniques.

12 Claims, 12 Drawing Figures

CIRCUIT BOARD WITH SELF-LOCKING TERMINALS

This application is a division of our copending application Ser. No. 808808, filed June 22, 1977, for Circuit Board with Self-Locking Terminals, now U.S. Pat. No. 4,107,836 issued Aug. 22, 1978.

This invention relates to electrical circuit assemblies and methods of manufacturing the same, and more particularly to improvements in circuit boards and to methods for manufacturing the same.

In general, a printed circuit board comprises an electrically insulating base having an individual or composite electrical conductive pathways on at least one surface thereof, and one or more apertures communicating between opposite surfaces on the insulating base. At least some of the apertures are surrounded at least in part by extensions of the conductive pathways ("terminals") which provide connection points between the conductive pathways and electrical and electronic components. Numerous systems are well known in the art for mounting electrical and electronic components and connectors onto printed circuit boards. Typically, the components are provided with leads, in which case the components can be mounted to the board with their leads extending into and through the board apertures. Permanent electrical and mechanical connection between the components and the circuit board is achieved by soldering the components leads to the terminals surrounding the apertures. The component leads may be individually soldered to the board, e.g. as by hand soldering. However, connecting each lead in such manner is a tedious process. Accordingly, the art has developed various systems by which a plurality of soldered connections to a circuit board may be accomplished in a single mass soldering operation e.g. employing pot soldering or wave soldering techniques.

Although soldered connections are considered to be highly effective to establish reliable electrical and physical connections between component leads and a circuit board, the soldering operation adds significantly to manufacturing costs. Furthermore, it generally is necessary to clean soldered assemblies following soldering, and such cleaning also may add appreciably to manufacturing costs. Moreover, the relatively high temperatures typically required by mass soldering operations may damage heat sensitive components and/or may warp or delaminate the circuit board. Still another disadvantage of soldering is that replacing a faulty component is relatively time consuming and difficult, requiring both unsoldering and re-soldering operations. Moreover, such unsoldering and re-soldering operations may result in damage to the circuit board, adjacent components or other soldered connections on the board.

Solderless wrapping, crimping and socketing are known in the art and offer alternative methods to soldering for mechanically and electrically connecting electrical and electronic components onto printed circuit boards. Such methods rely on metal deformation of the jumper wire, the component lead or socket elements, or both, to form a metallurgically sealed electrical interface. Typically such methods require special equipment, are generally labor intensive, and also may have certain connection spacing requirements which limits their applicati on in the case of high density configurations. Moreover, the stability of the inter-connections formed by such methods depend in part upon the residual elastic stress remaining in the deformed metal, and thus may fail in the field due to stress relaxation. An additional requirement of such methods is to provide sufficient degree of metal deformation to break-down any surface oxides and other surface contaminations that may be present on the mating metallic members, i.e. so as to assure a true metal-to-metal contact. As a practical matter a common practice in the art is to plate the mating members prior to assembly with a non-corrosive metal such as gold. Such plating requirements may add significantly to manufacturing costs. Moreover, while such prior art solderless interconnections theoretically offer an advantage over soldered connections of easy separability, in practice solderless interconnections may be subject to degradation due to metal loss from one or both contacting members upon repeated mating and unmating interconnections. Thus, such prior art solderless interconnections potentially offer advantages over soldered interconnections only in certain application.

Still other methods of forming interconnections between printed circuit boards and electrical components are described in Swengel U.S. Pat. No. 2,958,064 and Hotine et al U.S. Pat. No. 3,275,736.

Swengel proposes forming a laminated circuit board with integral sockets for gripping electrical component leads or the like. According to Swengel, one or more layers or sheets of a resilient and rubbery-type material are bonded to a circuit board. The resilient layer includes apertures corresponding in location to the circuit board apertures. The apertures in the resilient layer are of a diameter slightly less than that of the lead to be inserted therein, whereby the resilient layer may mechanically grip a lead loaded in its apertures. In order to assure electrical continuity a circuit extension, preferably integral with the circuit pathways, is provided projecting into the aperture. An obvious disadvantage of the Swengel circuit board is the need for the resilient sheets which may add to the cost of manufacture and may also substantially increase the weight of the board. Moreover, the Swengel's resilient sheets prevent visual inspection of the circuit, e.g. to detect defects. Still another disadvantage of Swengel is the reliance on the mechanical force of deformation of a rubbery-type material to lock the component and board together. As is well known in the art such forces may lessen in time due to physical effects such as creep or stress relaxation and thus result in circuit failure in the field.

Hotine et al disclose an electrical connecting unit which basically comprises a plurality of relatively thin spring finger-like members disposed so as to extend partly over the board apertures. According to Hotine et al the finger-like members have pointed ends, and are configured so as to define an aperture with respect to one another which aperture is slightly smaller in dimension than the cross-section of the component leads to be inserted therein. According to Hotine et al the finger-like members mechanically lock the component leads to the board; however, the required electrical connections to the circuit pathways are made by spot welding the individual finger-like members to the leads. Hotine et al reports that such redundant multiple welds result in improved reliability of the interconnections in the field. Obviously, the Hotine et al system is relatively costly. Moreover, the Hotine et al system is not believed to be practical in the case of high density applications due to the connection geometry, and the requirement for sufficient tie down area for adhesive or mechanical attachment of the individual finger-like members to the board.

Moreover, sufficient connector spacing is required so as to permit access to the individual finger-like members for welding.

It is thus a principal object of the present invention to provide a novel interconnection system for electrically and mechanically attaching electrical and electronic components to a printed circuit board. Another object of the invention is to provide a solderless interconnection system which overcomes the aforesaid problems of the prior art. Yet other objects of the present invention are to provide novel printed circuit boards having integral solderless self-locking terminals for mating with component leads, and to methods for producing circuit boards of the type above described.

Generally, in accordance with the present invention a circuit board having apertures therethrough is provided. The board has self-locking terminals which partially cover at least some of the apertures. The terminals, which are integral extensions of the circuit pathways, are adhesively anchored to the circuit board at the terminal peripheries and by a dielectric overlay. The latter also provides environmental protection and electrical insulation to the circuit conductive pathways. A particular feature and advantage of the invention resides in the provision of an unique tie-down shoulder on each terminal which increases substantially the anchoring force provided by the dielectric overlay. The circuit board and integral sockets may be formed by photoimaging and chemical resist techniques as will be described in detail following.

As used herein the term "printed circuit board" is intended to refer to circuit boards formed by conventional photo-imaging and resist techniques as well as by stenciling and the like. The particular circuit design is a matter of choice and will be determined by desired electrical and electronic considerations well known to the art and which form no part per se of the instant invention. The terms "electrical and electronic components " are intended to refer to both active and passive electronic components, lead and jumper wires and the like.

For a further understanding of the nature and objects of the present invention, reference should be had to the following detailed description taken in connection with the accompanying drawings wherein like numbers depict like parts and:

Figure 1:
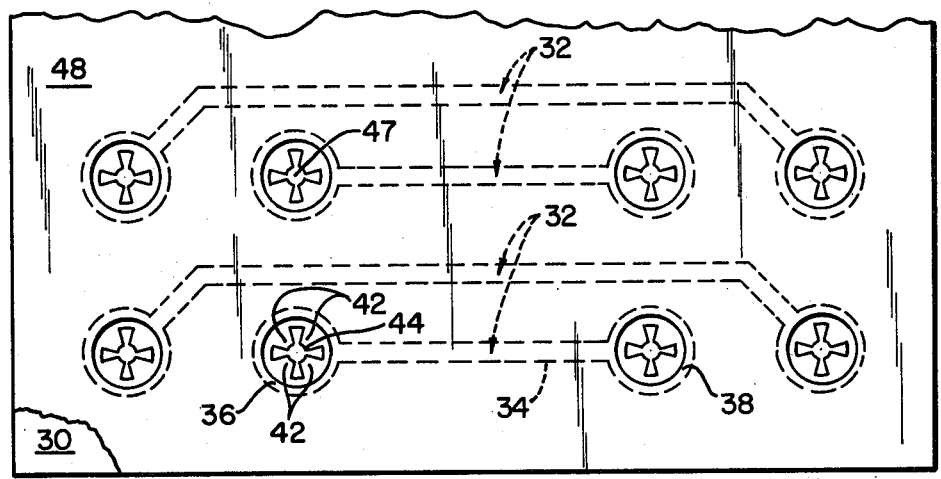
FIG. 1 is a top plan view of one form of circuit board constructed in accordance with the present invention.

One embodiment of connection system in accordance with the present invention is shown in FIGS. 1–4 of the drawings. In the embodiment of FIGS. 1–4 the circuit board comprises a rigid dielectric panel or sheet 30 of conventional circuit board insulating material, e.g. 0.062 inch thick phenolic resin board. (For convenience of illustration only a portion of the circuit board is shown in the drawings). A plurality of electrically conductive metallic pathways 32, each comprising an elongate central portion 34 extending between terminal ends 36 and 38, respectively, are provided on at least one surface, e.g. surface 39 of panel 30. For convenience of illustration, circuit pathways are shown on only one surface of panel 30. It will be understood however, that panel 30 may carry circuit pathways on both outer surfaces thereof, and if desired, panel 30 may comprise a plurality of insulating panels and including one or more internally carried layers of circuit pathways. One or more apertures 40 are provided through panel 30 communicating between opposite surfaces on the panel. The conductive pathways have dimensions, and shapes corresponding to desired design criteria, e.g. current carrying capacity and card geometry.

As seen in the drawings terminal ends 36, 38 and integral extensions of central portions 34 surround apertures 40 at least in part. Apertures 40 typically are round holes. As will become clear from the description following the diameter of apertures 40 will depend in part on the diameter of the lead to be loaded therein. For example, for a typical lead of about 0.030 inch diameter aperture 40 should have a diameter of about 0.070 inches. As seen particularly in FIGS. 1 and 3 each terminal end (e.g. 36) comprises a raised generally annular metallic member and including a plurality, e.g. four spaced spring fingers 42 each disposed pointing generally inwardly from the annulus of aperture 40 for a distance, but stopping short of the center of aperture 40. As will also become clear from the description following, it is preferred that the innermost, i.e. central edges of fingers 42 are generally concave, e.g. at 44, so as to provide an extending mating surface with the convex surface of component leads 45 to be loaded therein (see FIG. 4). Thus, edges 44 of fingers 42 together define a generally round aperture 47, which is slightly smaller in dimension than the size of a typical component lead. For example, for a typical component lead of diameter of 0.030 inches, fingers 42 may be shaped and dimensioned so as to define generally annular interspace of about 0.020 inches.

An important feature and requirement of the present invention is to securely anchor terminal ends 36 and 38 to the insulating panel 30.

Terminal ends 36 and 38 are called upon to perform the fourfold functions of (1) electrically connect the conductor central pathways 34 and component leads 45, (2) mechanically hold and maintain the components, by their leads, to the insulating panel, (3) permit assembly of components by simple mechanical deflection, and (4) apply relatively high pressure against the component leads throughout the design life of the assembly.

Figure 2:
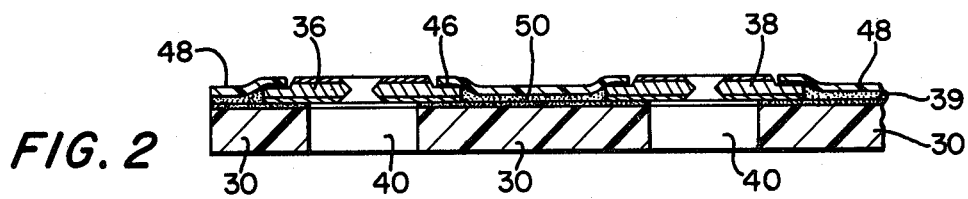
FIG. 2 is a side elevational view, partly in section of the circuit board of FIG. 1.
Figure 3:
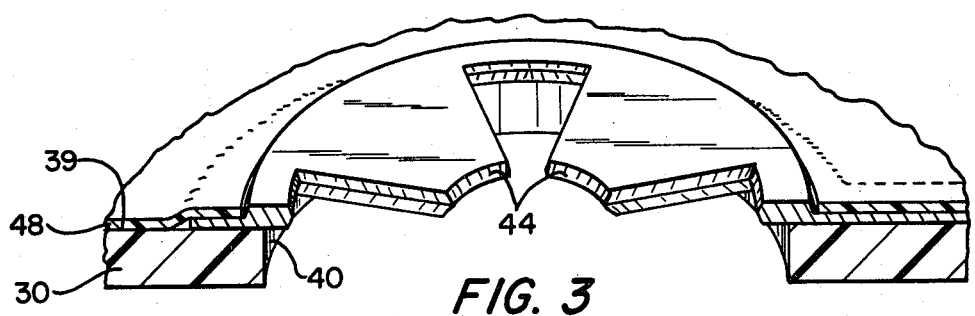
FIG. 3 is an enlarged perspective view, showing a portion of the circuit board of FIG. 1.
Figure 4:
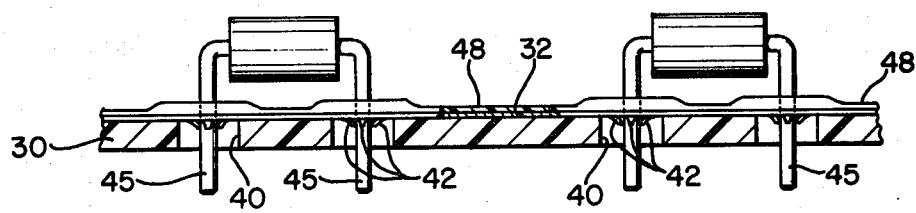
FIG. 4 is an enlarged side elevational view of the same portion of FIG. 3, and showing an exemplary connection to an electrical lead.
Figure 5:
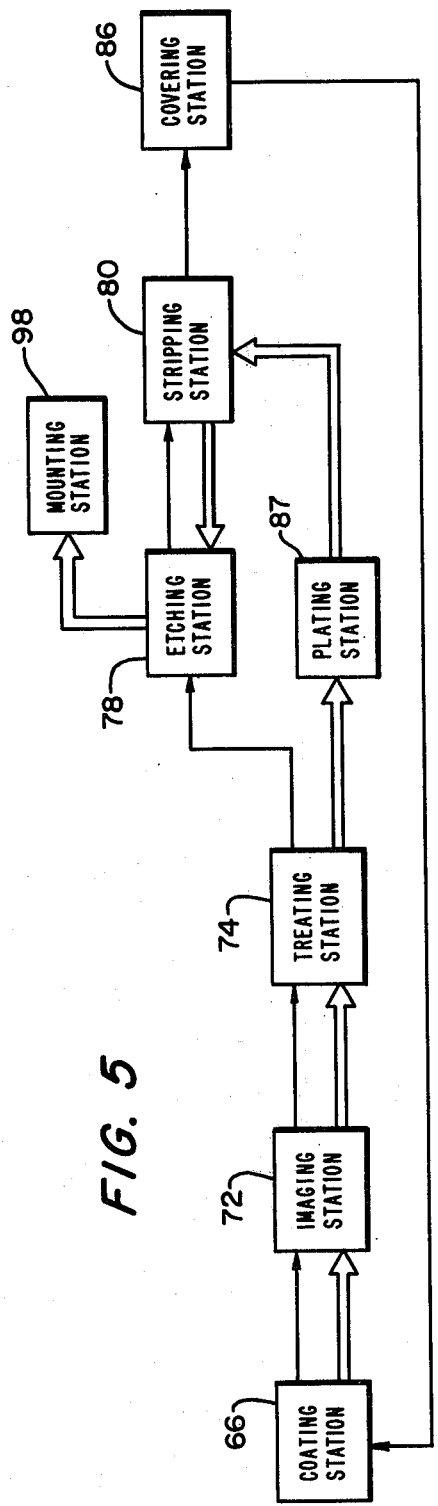
FIG. 5 is a side elevational view, diagramatically illustrating a process for producing the circuit board of FIG. 1.
Figure 6:
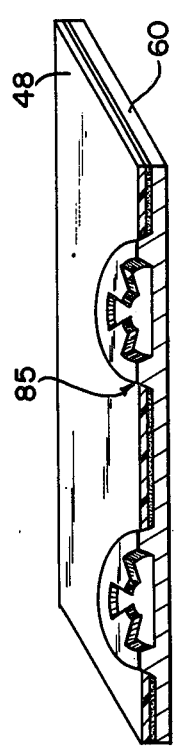
FIGS. 6–11 are perspective views of a circuit board at various stages of formation in accordance with the process of FIG. 5.

A deficiency of prior art self-locking terminal boards, e.g. as taught by Swengel is the failure to provide sufficient mating or hold-down area between the circuit terminals and the substrate board for adequately adhesively anchoring the terminals to the board. Sufficient hold-down area is required so as to prevent the terminals from delaminating from the board during lead insertion or removal and also to ensure a constant operating force. As will be appreciated providing sufficient hold-down area between the terminals and the surrounding board may present a particularly acute problem in the case of high density applications. The present inventions offers a solution to this problem by providing terminal ends 36 and 38 with outwardly depending integral shoulders or steps 46 of reduced thickness as compared with the main body of the terminal ends. For example, assuming the main body of the terminal ends including finger areas 42 have a thickness of about 0.01 inch, shoulders 46 may have a thickness in the range of about 0.001 to 0.005 inches, preferably about 0.003 inches. Shaping the terminal ends in such manner makes it possible to capture the reduced thickness shoulders 46 with an adhesive coated dielectric film overlay 48. Thus, as seen in FIGS. 2 and 4 the terminal ends, i.e. the flat bottom surface of terminal end 36 and its associated conductor pathway 34 are bonded to the top surface of rigid panel 30 by an adhesive 50. Film 48 is also bonded to the top surface of panel 30 (except where presented by terminal ends 36 and 38 and the conductor pathways 34). Film 48 also extends over terminal shoulders 46 whereby to capture and cover the shoulders 46 at least in part. As seen in FIG. 3 film 48 preferably extends to the main, e.g. raised areas of terminal ends 36 and 38; however film 48 should not cover entirely terminal ends 36 and 38. Film 48 preferably is formed of an electrically insulating polymeric film material such as a polyester, polypropylene, polyimide, cellulose triacetate, polyethylene terephthalate or other readily available film. The thickness of film 48 is not critical to the invention; however, film 48 would be relatively thin and should possess sufficient flexibility whereby the film can be shaped in close contact to the conductor pathways 34 and the shoulder areas 46 of terminal ends 36 and 38 with minimum film distortion. Film 48 is bonded to the circuit rigid panel 30, terminal ends 36 and 38, terminal shoulders 46 and the conductor pathways 34 by suitable adhesive means such as a modified epoxy, or acrylic based adhesive.

FIGS. 5–11 illustrate one method of forming a printed circuit board in accordance with the present invention.

An electrically conductive, resiliently flexible metallic sheet 60 preferably of a thickness substantially equal to that desired for the terminal ends 36 and 38 raised areas and fingers 42 is provided. In the illustrated case metallic sheet 60 comprises 0.01 inch thick phosphor bronze ST. One skilled in the art will recognize however that other electrically conductive, resiliently flexible metallic materials may be employed. The top and bottom surfaces 62 and 64 of the metallic sheet 60 are then cleaned employing conventional techniques, and top and bottom surfaces 62 and 64 are then coated at a coating station 66 (FIG. 5) with conventional acid resist materials layers 68 and 70, respectively. Then one side of metallic sheet 60 (e.g. top side 62 and resist layer 68) is exposed, at an imaging station 72 to a negative art work image of the desired raised areas of terminal ends 36 and 38 and fingers 42. Simultaneously bottom resist layer 70 is entirely exposed to light at imaging station 72. Those areas of resist coating 68 and 70 exposed to light are altered to a lower molecular weight polymer. The sheet is then immersed in a preferential solvent and developed at a treating station 74, with the result that the exposed bottom resist layer 70 and the exposed portions of resist layer 68 remain intact while the unexposed areas of coating 68 are dissolved leaving resist layer 68 in a positive image of the raised areas of terminal ends 36 and 38 and fingers 42.

The next step involves chemically milling the exposed metallic areas of metallic sheet 60 by contacting the sheet 60 with an acid etching solution at an etching station 78. Etching is controlled so as to remove metal to a depth which substantially equals that desired for the circuit conductor areas and terminal shoulders of the finished circuit borad. For example, if 0.003 inch thick circuit conductor pathways and terminal shoulders are desired, etching should be controlled to a depth of about 0.007 inches. Spray etching has been found to be especially suitable for obtaining precision control of the etching step.

Figure 7:
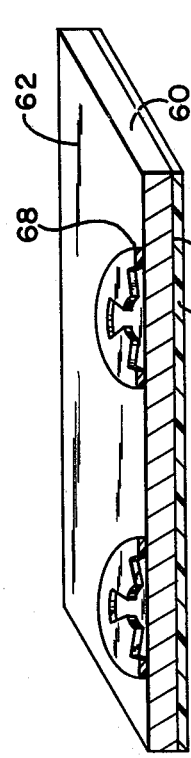

Thereafter, the etched sheet is treated in a stripping station 80 wherein the acid resist remaining on the sheet is removed from both sides of the sheet. A metallic sheet having a contoured surface 62 with raised areas 84 as shown in FIG. 7 results.

Figure 8:
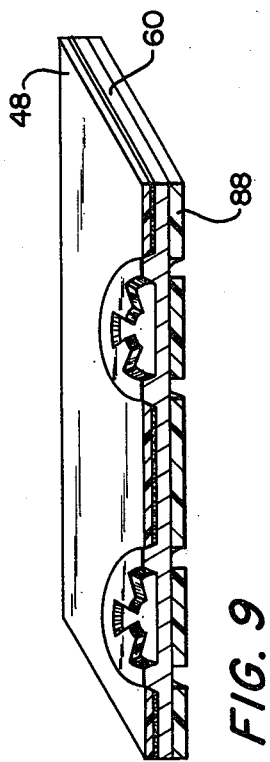

A feature and advantage of the present invention is the ability to easily emboss dielectric overlay film 48 to the circuit board. As will become clear from the description following film 48 is called upon to perform the two-fold functions of (1) mechanically anchor the terminals to the substrate panel and (2) electrically insulate the circuit pathways. Thus, in accordance with a preferred embodiment of the invention the dielectric overlay film 48 is bonded to the FIG. 7 structure. Thus, the next step in the process of the present invention is to partially cover all but the raised areas 84 on the contoured surface 62 of sheet 60 with a dielectric overlay in the form of a thin, flexible electrically insulating film such as one mil (0.001 inch) polyimide film 48. As shown in FIG. 8, film 48 is pre-punched so as to cover substantially the entire surface 62 of metallic sheet 60 other than raised areas 84. Film 48 is applied to sheet 50 at a covering station 86 (FIG. 5), and the film is bonded to the metallic sheet by means of a suitable adhesive, for example a thermoplastic adhesive such as a modified acrylic (available from Dupont Company). One skilled in the art will recognize an advantage of applying film 48 at this stage is that the film will not be distorted by the circuit pathways (which are still undefined). Moreover, the possibility of voids and pressure gaps is also reduced. Furthermore, since areas 84 are raised, the possibility of adhesive flow onto the terminals (also not fully defined) is relatively remote. The resulting structure appears substantially as shown in FIG. 8.

Figure 9:
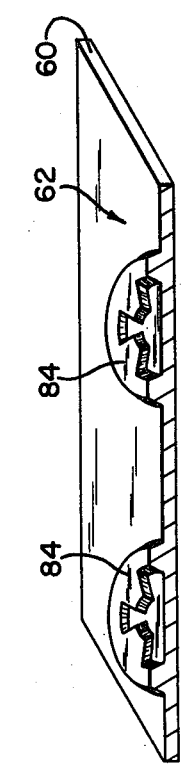

Another feature and advantage of the present invention is the ability to easily and economically plate only the terminal areas of the circuit board. Thus, in accordance with a preferred embodiment of the invention, the FIG. 8 structure is then returned to coating station 66 where the sheet lower surface 64 is again coated with layer 88 of a conventional resist material. Then using one or more of the raised terminal areas 84 to insure front-to-back image registration, resist layer 88 is exposed to a negative art work pattern which defines the actual terminal aperture 47, shoulder 46 and conductor 32 at imaging station 72. The sheet is then treated in treating station 74 with the result that exposed areas of the resist layer 88 remain intact while the unexposed areas are dissolved away as before. The resulting structure appears substantially as shown in FIG. 9. It should be noted that at this stage in the process metallic sheet 60, while contoured, still is continuous.

The next step involves plating the exposed metallic areas of sheet 60 by a conventional plating technique, e.g. by electrodeposition in known manner of a precious or semi-precious material such as gold at a plating station 87. Inasmuch as the metallic sheet 60 is still continuous at this stage of the processing, assuring electrical continuity for plating purposes to each terminal end is assured. Film layer 48 effectively masks the entire top surface 62 of sheet 60 other than areas essentially corresponding to the raised areas of terminals 36 and 38 and fingers 42, while resist layer 88 effectively masks the entire bottom surface 64 of sheet 60 except areas corresponding to the bottom surfaces of terminal ends 36 and 38, fingers 42 and the conductors 32. As a result deposition of the precious metal is restricted essentially to those areas of sheet 60 which ultimately will become parts of the terminals, i.e. plated areas 92 and 94. One skilled in the art will recognize an advantage of the present invention in that plating the terminals thus is an especially simple procedure, and which may result in a relatively low consumption of precious metal. Still another advantage of the invention is that the inner edges 44, i.e. the actual contact areas of the terminals, are also plated.

Figure 10:
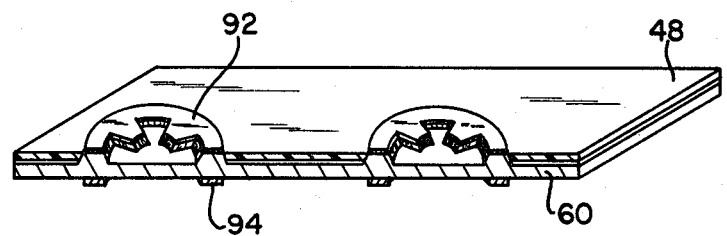

Following plating the resist layer 88 is then stripped from surface 64 at stripping station 80. The resulting structure appears substantially as shown in FIG. 10.

Thereafter, using the plates areas 92 and 94 as a resist, the metallic structure is returned to etching station 78 so as to complete the definition of the terminals, terminal fingers 42 and conductor 32. The structure which results is shown in FIG. 11.

Figure 11:
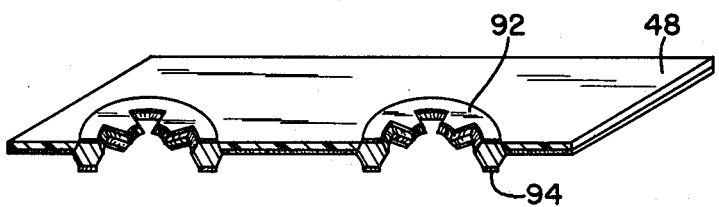

At this point, the FIG. 11 structure is mounted at a mounting and laminating station 98 onto a rigid panel or sheet 30 such as a 0.062 mil phenolic resin board. The latter is predrilled with a plurality of apertures 40 which correspond substantially to the placement on the FIG. 11 structure of terminal ends 36 and 38. The panel 30 and FIG. 11 structures are then laminated together in known manner, e.g. employing a thermosetting adhesive. The resulting structure is a printed circuit board of the type shown in FIGS. 1–4.

Figure 12:
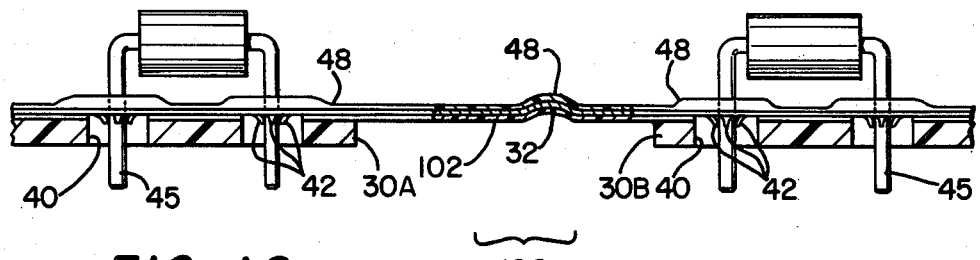
FIG. 12 is a side elevational view, partly in section of an alternative construction of circuit board in accordance with the instant invention.

One skilled in the art will recognize that the mechanical locking force of the terminal fingers can be varied to meet specific design requirements, for example by employing different metallic substrate material, changing the thickness of the metallic substrate material, adjusting the size or shape of apertures 40 or the size or shape of fingers 42, or by a combination of one or more of the foregoing. For example, if a relatively large spring force is desired, the metallic substrate starting material (sheet 60) may be spring steel. In such case it may be desired to plate-up the terminal contact areas (station 87) with a preferred electrically conductive material such as copper, or copper followed by tin. Processing is otherwise as before. Moreover, if desired, the foregoing process can be modified so as to provide a circuit board having flexible conductor pattern area 100, e.g. by providing rigid panels 30A, 30B adjacent and supporting only terminal ends 36 and 38. Obviously, this will leave portions of the conductors 32 exposed; however, if desired conductors 32 can be covered by a thin, flexible dielectric film 102 adhesively secured to the conductors 32, rigid panels 30A, 30B and dielectric overlay film 48 (FIG. 12). Moreover, the foregoing process of the present invention may also be adopted to produce two-sided or multi-layer circuit boards. Still other changes will be obvious to one skilled in the art.

What is claimed is:

1. A circuit board assembly of the type adapted for solderless attachment thereto of components by their leads to said board, and comprising in combination:
   (A) rigid, dielectric panel having at least one aperture formed between opposite surfaces thereof;
   (B) at least one electrically conductive circuit formed of a resiliently flexible metal, rigidly affixed at least in part to a surface of said dielectric panel, said electrically conductive circuit having (i) at least one integral termination which essentially surrounds said at least one aperture in said panel, said termination including (ii) a plurality of spaced fingers (a) disposed inwardly for a distance from edge areas of said aperture, and (b) adapted for locking mating with said component leads; and
   (C) an apertured, flexible, dielectric material fixedly attached at least in part to said surface so as also to cover said at least one conductive circuit at least in part, with its apertures positioned over said apertures in said rigid, dielectric panel;
   said integral termination, and said fingers having areas of cross-sectional thickness greater than the cross-sectional thickness of said electrically conductive circuit, said termination including a peripheral shoulder area (i) of reduced cross-section thickness and (ii) a plan area greater than said apertures in (a) said rigid, dielectric panel, and (b) said flexible, dielectric material, said peripheral shoulder being fixedly attached to said dielectric panel at least in part; and
   said flexible dielectric material overlaying and fixedly attached at least in part to said termination peripheral shoulder area.

2. A circuit board according to claim 1 wherein said resiliently flexible metal comprises a phosphor bronze.

3. A circuit board according to claim 1 wherein said spaced fingers and said conductive circuit are plated at least in part with an electrically conductive metal.

4. A circuit board accordiang to claim 1 wherein said resiliently flexible metal comprises a spring steel.

5. A circuit board according to claim 4 wherein said spaced fingers and said conductive circuit are coated with an electrically conductive metal.

6. A circuit board according to claim 1 wherein said flexible, dielectric material comprises a polymeric film material.

7. A circuit board according to claim 1 wherein said fingers terminate with inwardly facing generally concave edges.

8. A circuit board according to claim 1 wherein said termination peripheral shoulder areas have a cross-sectional thickness in the range of 0.001 to 0.005 inches, and said fingers and other areas of said termination have a cross-sectional thickness of about 0.01 inch.

9. A circuit board according to claim 8 wherein said termination peripheral shoulder areas have a cross-sectional thickness of about 0.003 inches.

10. A circuit board according to claim 1, and further including at least one electrical or electronic component electrically and mechanically connected to said board with its lead(s) extending through and locked by said fingers in said at least one termination.

11. A circuit board according to claim 1 and including two rigid, dielectric panels having electrically conductive circuits formed of resiliently flexible metal extending between said two rigid, dielectric panels, said extending circuits being (i) integral with electrically conductive circuits on said rigid, dielectric panels, and (ii) covered at least in part by said flexible, dielectric material.

12. A circuit board according to claim 11 and further including at least one electrical or electronic component electrically and mechanically connected to said board with its lead(s) extending through and locked by said fingers in said at least one termination.

* * * * *